United States Patent
Uram et al.

(10) Patent No.: US 8,570,023 B2
(45) Date of Patent: Oct. 29, 2013

(54) SYSTEM AND METHOD FOR PHASE LOAD DISCOVERY

(75) Inventors: George Uram, Murrysville, PA (US); Jeff Gallagher, Covington, LA (US)

(73) Assignee: Sensus USA Inc., Raleigh, NC (US)

(*) Notice: Subject to any disclaimer, the term of this patent is extended or adjusted under 35 U.S.C. 154(b) by 741 days.

(21) Appl. No.: 12/629,338

(22) Filed: Dec. 2, 2009

(65) Prior Publication Data

US 2010/0134089 A1  Jun. 3, 2010

Related U.S. Application Data (60) Provisional application No. 61/119,483, filed on Dec. 3, 2008.

(51) Int. Cl.
   *G01R 19/00* (2006.01)
(52) U.S. Cl.
   USPC .......................................................... 324/66
(58) Field of Classification Search
   USPC .......................................................... 324/66
   See application file for complete search history.

(56) References Cited

U.S. PATENT DOCUMENTS

| | | | |
|---|---|---|---|
| 5,617,329 A * | 4/1997 | Allison et al. ............... | 700/286 |
| 6,667,610 B2 | 12/2003 | Piesinger | |
| 7,031,859 B2 | 4/2006 | Piesinger | |
| 7,372,246 B2 | 5/2008 | Marsden et al. | |
| 8,013,592 B2 * | 9/2011 | Giubbini et al. ............ | 324/76.77 |
| 8,143,879 B2 * | 3/2012 | Caird ............................... | 324/66 |
| 2003/0158677 A1 | 8/2003 | Swarztrauber et al. | |
| 2003/0176952 A1 * | 9/2003 | Collins et al. .................. | 700/286 |
| 2003/0184275 A1 | 10/2003 | Slade et al. | |
| 2009/0055031 A1 * | 2/2009 | Slota et al. .................... | 700/287 |

FOREIGN PATENT DOCUMENTS

| | | |
|---|---|---|
| WO | 95/00991 A1 | 1/1995 |
| WO | 03/070512 A2 | 9/2003 |
| WO | 2005/116668 A1 | 12/2005 |

OTHER PUBLICATIONS

PCT Search Report dated Mar. 29, 2010.

* cited by examiner

*Primary Examiner* — Jeff Natalini
(74) *Attorney, Agent, or Firm* — Andrus, Sceales, Starke & Sawall, LLP (57) ABSTRACT

A system and method for determining the relative phase of each of a plurality of load meters connected to a three-phase power distribution system. The system includes a gateway that communicates information to and from each of the individual load meters. The gateway generates a timing pulse that is received by each of the load meters. Based upon the delay from the receipt of the timing pulse to the next zero crossing of the single phase power supply received by the meter, the utility can determine the phase of the individual meter. The system can include a feeder meter connected to each phase of the electrical supply system to determine the energy consumption for each of the meters connected to a specific phase. The utility can compare the energy consumption information from the feeder meter to all of the load meters connected to the same phase to determine whether any energy theft is occurring.

9 Claims, 5 Drawing Sheets

SYSTEM AND METHOD FOR PHASE LOAD DISCOVERY

CROSS-REFERENCE TO RELATED APPLICATION

The present application is based on and claims priority to U.S. Provisional Patent Application Ser. No. 61/119,483, filed on Dec. 3, 2008.

BACKGROUND OF THE INVENTION

The present disclosure generally relates to a system and method for determining the load balance on an electric circuit. More specifically, the present disclosure relates to a method and system that sends a timing pulse to each of the load meters connected to the three phases of a utility energy system and receives a response that allows the system to determine the phase for each of the load meters.

Electrical utilities provide three-phase power across utility lines. Transformers are located at various locations near residential and commercial sites that provide a point of connection for each of the commercial and residential sites, which are referred to as loads. Each of the loads can be connected to one of the three phases of electrical power from the utility. Typically, each load includes its own electricity meter to measure the amount of electricity consumed at the customer site, which are referred to as a load meter.

When a new load is added to a line downstream from a transformer, the load is connected to one of three phases in a conventional manner. During initial configuration of the various loads served by a transformer, the utility attempts to balance the load across each of the three phases. However, the actual load on each of the three phases may become unbalanced as additional loads are added to the lines served by the transformer. Although it is desirable to balance the loads on each of the three phases, it is currently difficult to determine the actual load connected to each of the three phases. Therefore, a need exists for a method and system for determining the aggregate load on each of the three phases of a utility power supply such that the loads can be balanced.

In addition to the desire to balance loads across the three phases, another problem that faces a utility is the theft of energy. In some geographic locations, the theft of energy has proven to be a significant loss of revenue to the utility provider. However, there is currently no adequate way of determining where the energy theft is taking place. As an example, the utility may be able to determine the total amount of power being supplied by the utility and compare the total power drawn from the utility to the metered energy at the plurality of loads being supplied with electricity. If the total consumption of the electrical load is below the overall generation by the utility, the difference can be attributed to line losses and energy theft. If the utility determines that a significant amount of energy is being lost, this loss is typically attributed to energy theft. Since this energy theft typically occurs by a direct, unmetered connection to the electrical supply wires, it is difficult if not impossible to accurately pinpoint the location of the energy theft. Therefore, a need exists for a better system and method for monitoring for energy theft and determining the location of such theft.

SUMMARY OF THE INVENTION

The present disclosure generally relates to a system and method for balancing electrical loads on a three-phase power distribution system. The method and system of the present disclosure allows a utility to both balance electrical loads and determine whether energy theft is occurring.

The system of the present disclosure includes a plurality of load meters positioned in the field and each connected to a supply line that includes one of three phases of a three-phase power distribution system. In one embodiment of the disclosure, a feeder meter is positioned along the supply line for each of the three phases between a transformer and each of the load meters. Each feeder meter receives one phase of the three-phase power supply and monitors the amount of energy consumed by the load meters positioned downstream from the feeder meter.

To determine the phase of each of the load meters, a timing pulse is generated from a known location. The timing pulse is received by each of the feeder meters and each of the load meters. Upon receipt of the timing pulse, each of the load meters determines a time delay from receipt of the timing pulse until a landmark value of the single phase signal received by the meter. In one embodiment of the disclosure, the landmark value of the single phase signal is a zero crossing of the single phase signal.

In addition to the load meter, each of the feeder meters also records a time delay from the receipt of the timing pulse until the zero crossing of the single phase signal.

Once all of the load meters and the feeder meters have recorded the delay to the next zero crossing, the feeder meters transmit the delay to an end server. Since each of the feeder meters is connected to a known phase, the time delay from each feeder meter is used as a time reference for the signal phase connected to the feeder meter.

The time reference delay for each of the three phases are then compared to the recorded time delay from each of the load meters. Each of the load meters is assigned to one of the three phases based upon the closest reference time delay to the recorded time delay from the load meter. In this manner, each load meter is assigned to one of the three phases of the three-phase power distribution system.

Once a phase has been assigned to each of the load meters, each of the load meters can transmit power consumption information to the end server. The end server compiles the energy consumption information and determines the amount of energy consumed on each of the three phases. If the amount of energy consumed on each of the three phases is unbalanced, the system generates an alarm signal to indicate the unbalanced condition. Based upon this unbalanced condition, load meters can be moved from one phase to another or when new load meters are added to the power distribution system, the new load meters can be added to the phase having the lowest energy consumption.

In addition to balancing loads across the three phases of the three-phase power distribution system, the method and system of the present disclosure allows for theft detection. Specifically, the energy consumption information from all of the load meters fed by the feeder meter are combined. This combined value is then compared to the energy consumption determined by the feeder meter for the specific phase. If the aggregated energy consumption information from each of the meters is well below the consumption information from the feeder meter, this indicates that energy is being consumed and not metered. This unaccounted for energy consumption is often due to either significant line losses or, more typically, theft.

BRIEF DESCRIPTION OF THE DRAWINGS

The drawings illustrate the best mode presently contemplated of carrying out the invention. In the drawings.

DETAILED DESCRIPTION OF THE INVENTION

Figure 1:
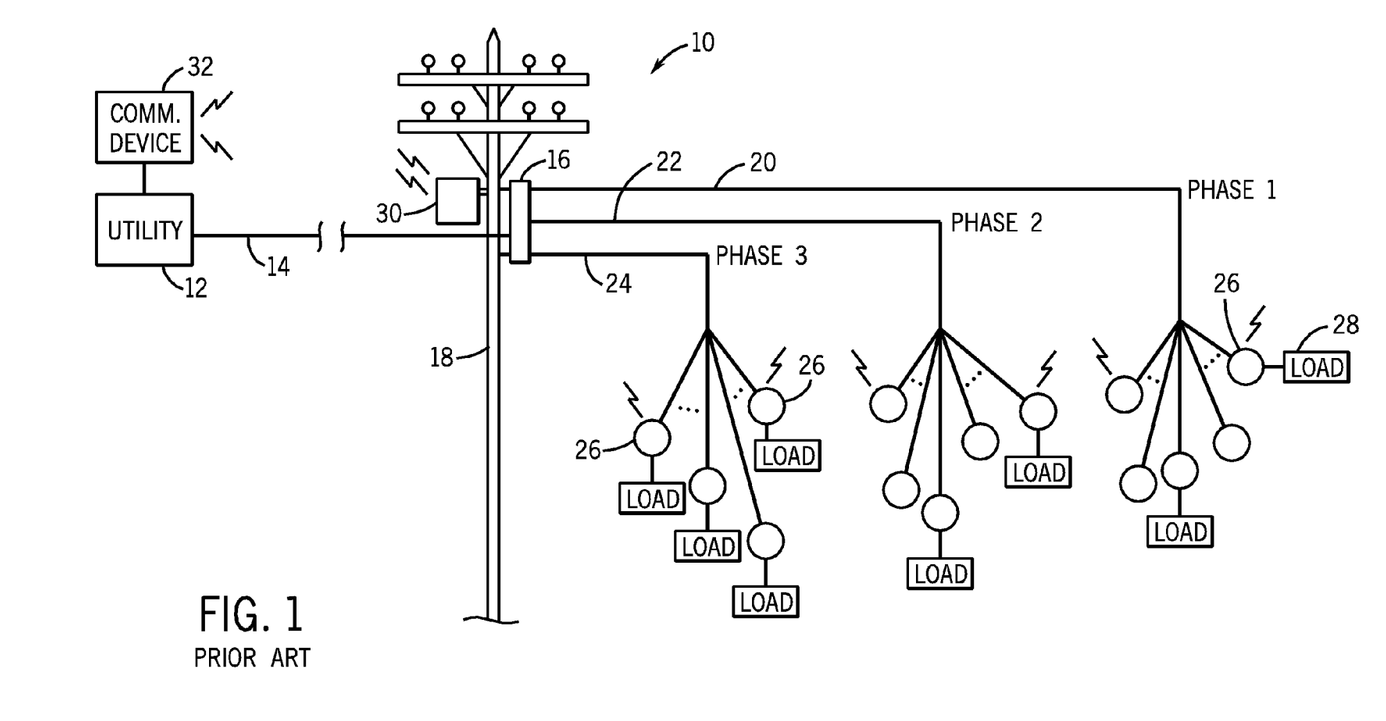
FIG. 1 is a schematic illustration of an electricity distribution system.

FIG. 1 illustrates a typical energy distribution system 10. In the energy distribution system shown in FIG. 1, the utility 12 provides a supply of three-phase electricity over a series of supply lines 14. As illustrated in FIG. 1, the supply lines 14 are received by a pole mounted transformer 16. The pole mounted transformer 16 is mounted to a utility pole 18 to step down the voltage of the supply of electricity carried on the supply lines 14. The transformer 16 includes multiple connections for three separate phases of the electricity. As shown in FIG. 1, the transformer provides a first phase along line 20, a second phase along line 22 and third phase along line 24. Each of the three phases supplied along the lines 20, 22 and 24 are 120° out of phase from each other, as is conventional. The three phases of the electricity are shown schematically in FIG. 3.

Referring back to FIG. 1, in the embodiment shown, a series of load meters 26 are connected to each of the three phases. Each of the load meters 26 measures the amount of electricity consumed by a load 28 at a residence or small business. Each of the load meters 26 and loads 28 could represent a small commercial facility or a residential home. In the embodiment shown in FIG. 1, only a small number of the load meters 26 and loads 28 are shown for each of the three phases of electrical power. However, it should be understood that a vast number of load meters and loads could be coupled to each of the three phases from the transformer 16.

In the embodiment shown in FIG. 1, each of the load meters 26 includes a communication radio that allows each of the load meters 26 to communicate to a gateway 30. The gateway 30 is typically positioned remotely from the load meters 26 and communicates via RF signals to the load meters. The gateway 30 can be located at a radio tower site and connected to an antenna to enhance the communication range. The gateway 30 could alternatively be located at a utility substation. As an example, the gateway 30 and load meters 26 could be part of the FlexNet communication system currently available from Sensus USA Inc.

Each of the load meters 26 and the gateway 30 communicate with each other to relay energy consumption information as well as other data relevant to the operation of the load meters 26 and the gateway 30. As an example, the gateway 30 sends commands, requests, and timing pulses to the load meters 26. In addition to communicating to the load meters 26, the gateway 30 communicates with a communication device 32 at the utility to relay consumption related information to and from the gateway 30. As described above, the communication between the gateway 30 and the utility 12 can also exist utilizing the FlexNet communication system. The communication between the gateway 30 and a head end system/server at the utility can use many forms of PSTN, Ethernet, radio, microwave, satellite or other type of communication techniques.

The utility 12 typically includes a back end server that allows the utility to monitor the energy consumption by each of the load meters 26 connected to the electricity distribution system. The back end server at the utility 12 also allows the utility 12 to generate messages that are initially received by the gateway 30 and communicated out to each of the individual load meters 26. As an example, the back end server at the utility 12 could relay disconnect signals, interrogation signals or any other type of information that may be relevant to the operation of the individual load meters. The back end server located at the utility 12 allows the utility to aggregate any combination of the individual load meters 26 and generate electricity bills for each of the end users. The communication between the utility 12 and each of the individual load meters 26 is controlled by unique addressing information assigned to each of the load meters 26.

In the embodiment shown in FIG. 1, the combined loads coupled to each of the phases 20, 22 and 24 are shown as being relatively balanced. This configuration is desired by the utility such that each of the three phases of the electrical power supply is not overloaded. However, as additional loads/meters are added to the distribution system over a period of time, the balance on each of the three phases 20, 22 and 24 may become disrupted such that the overall load on phase 1 may be significantly higher than the load on phase 3. In the embodiment shown in FIG. 1, the utility 12 has no way of determining the electrical load on each of the three phases or determining from which phase each of the plurality of load meters 26 is drawing power.

Figure 2:
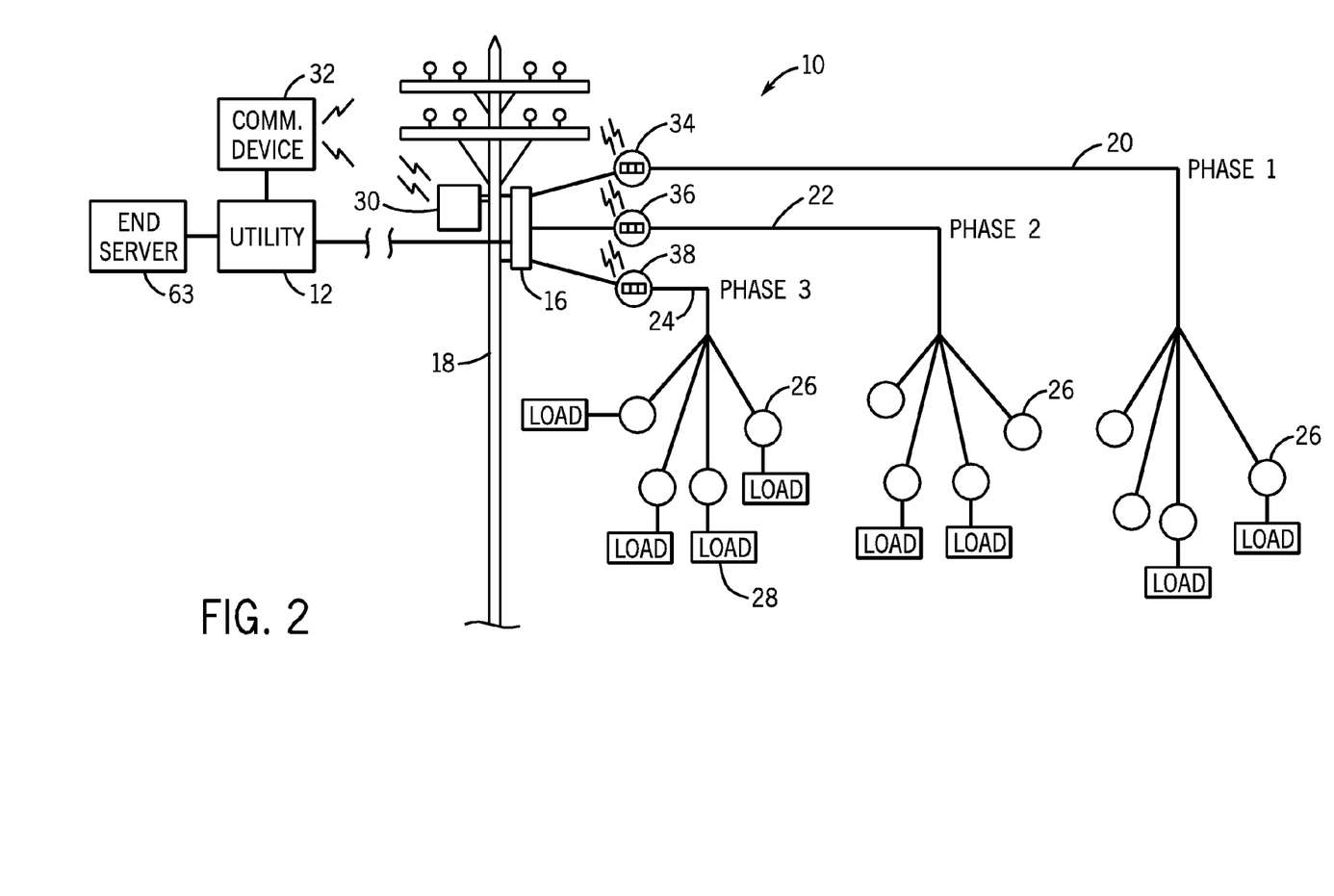
FIG. 2 is a schematic illustration of the electricity distribution system including the system and method of the present disclosure.

FIG. 2 illustrates a first embodiment of a system for determining which phase each of the load meters 26 are connected to in the energy distribution system 10. The electricity distribution system 10 shown in FIG. 2 is similar to the prior art system shown in FIG. 1 in that the pole mounted transformer 16 distributes the three phases of the electricity over a first phase line 20, a second phase line 22 and a third phase line 24. A plurality of load meters 26 are connected to each of the three supply lines 20, 22 and 24, as in the embodiment shown in FIG. 1.

In the embodiment shown in FIG. 2, the energy distribution system includes a first feeder meter 34 connected to supply line 20, a second feeder meter 36 connected to the second supply line 22 and a third feeder meter 38 connected to the third supply line 24. As illustrated in FIG. 2, each of the feeder meters 34-36 is positioned to determine the consumption of the combined loads connected to each of the respective supply lines 20, 22 and 24. The feeder meters 34, 36 and 38 include voltage sensing circuitry and are commercially available meters, such as available from FieldMetrics, Inc. Each of the feeder meters 34-38 is equipped with a radio transmitter such that the individual feeder meters 34-38 can communicate to the gateway 30.

Like the embodiment shown in FIG. 1, the gateway 30 communicates to a communication device 32 located at the utility 12 to receive and transmit information regarding the energy consumption of each of the individual load meters 26. In the embodiment of FIG. 2, the gateway 30 also communicates to each of the feeder meters 34-38 in the same manner as the communication to each of the load meters 26.

Figure 3:
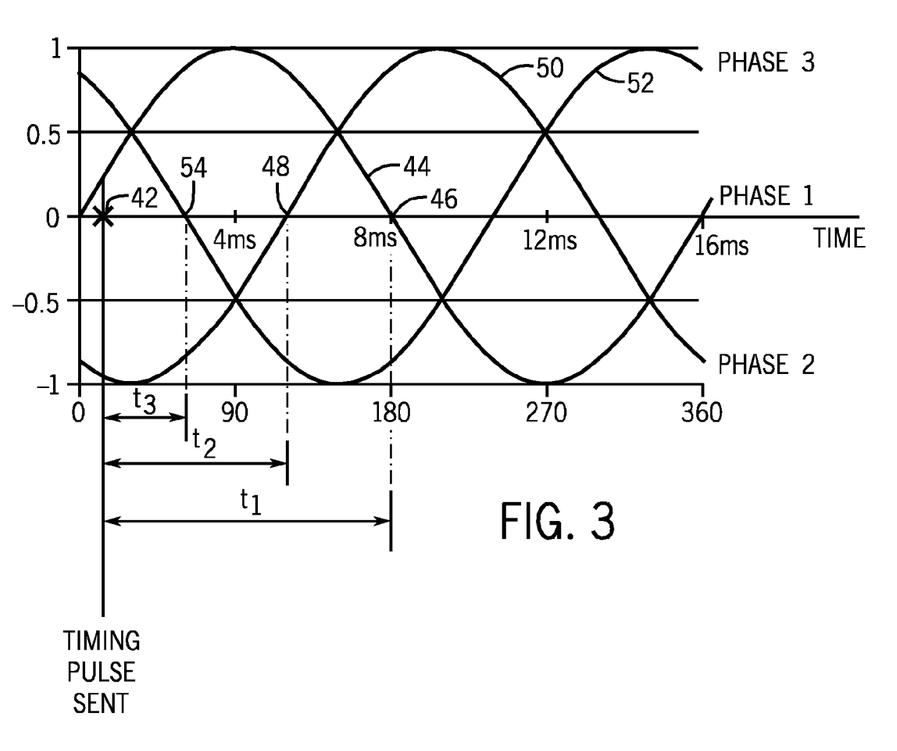
FIG. 3 is a graphic representation of the three phases of an electricity supply.

The operation of the system of a first embodiment of the present disclosure will now be described with reference to FIGS. 2 and 4. As discussed previously, the gateway 30 is mounted in a position to communicate with each of the load meters 26. In addition to communicating to each of the load meters 26, the gateway 30 can also be utilized in accordance with the present disclosure to allow the system to determine the phase of each of the load meters 26. As illustrated in step 40 of FIG. 4, the gateway 30 operates to send a radio frequency timing pulse that is received by each of the feeder meters 34-38 and each of the load meters 26. As illustrated in FIG. 3, the timing pulse 42 can be generated at any time relative to the three phases of the electrical power supply.

In accordance with the present disclosure, once the timing pulse has been generated, each of the feeder meters 34, 36 and 38 receives the pulse at nearly the same time relative to the other feeder meters. Upon receiving the timing pulse, the control electronics within each of the feeder meters 34-38 records the time delay from receipt of the timing pulse to the next zero crossing for the electrical supply being fed through the respective feeder meter. In the embodiment shown in FIG. 2, the feeder meter 34 is connected to phase 1, which is shown by line 44 in FIG. 3. The time delay from the timing pulse 42 until the zero crossing 46 is represented by time delay $t_1$ in FIG. 3. In the embodiment illustrated, the time delay $t_1$ is approximately seven milliseconds. The seven millisecond time delay $t_1$ is recorded by the feeder meter 34 coupled to phase 1 of the power supply.

Feeder meter 36 receives the timing pulse 42 at the same time and, since feeder meter 36 is receiving power from the second phase, the feeder meter 36 determines the time delay to the zero crossing 48 of the phase 2 voltage signal 50. In the illustration of FIG. 2, the time delay is shown by $t_2$. In the embodiment of FIG. 3, the time delay $t_2$ is approximately 4.5 milliseconds.

Finally, the feeder meter 38 is connected to the phase 3 voltage signal 52 and determines the time delay from the timing pulse 42 to the zero crossing 54. This time delay is shown by reference $t_3$ and is approximately 1.8 milliseconds, as illustrated in FIG. 3. The feeder meter 38 records the time delay $t_3$.

Although the present disclosure is shown and described as measuring the time delay from the timing pulse 42 until the zero crossing of one of the three phases, it should be understood that the time delay could be measured from the timing pulse to other landmark values of each of the three phases. As an example, the time delay could be measured from the timing pulse 42 until the positive peak of the voltage signal. Likewise, the landmark value could be the negative peak of each voltage phase. In the embodiment illustrated, the landmark value is represented by the zero crossing of each phase of the voltage signal. However, other landmark values could be utilized while operating within the scope of the present disclosure.

In addition, although the present disclosure is shown and described as measuring landmark values for the voltage of each of the three phases, it should be understood that other varying values of each of the three phases could be utilized while operating within the scope of the present disclosure. As an example, instead of utilizing the voltage signal, a current or power signal could be utilized to determine the time delay from the timing pulse 42 until a landmark value of the other alternate signals. As can be understood by the disclosure, the alternate signals from each of the phases must be delayed relative to each other such that the system and method can distinguish between the various phases.

During the initial setup of the system shown in FIG. 2, the utility is advised of the phase for each of the feeder meters 34, 36 and 38 based on the initial set-up of the system. Thus, the back end server at the utility 12 knows the phase of each of the feeder meters 34, 36 and 38.

Since the back end server at utility 12 knows the phase for each of the feeder meters 34, 36 and 38, the measured time delay from each of the feeder meters 34, 36 and 38 is designated as a reference time delay for the phase of the feeder meter. The reference time delays are stored in memory of the back end server and used in the manner to be described below.

Figure 4:
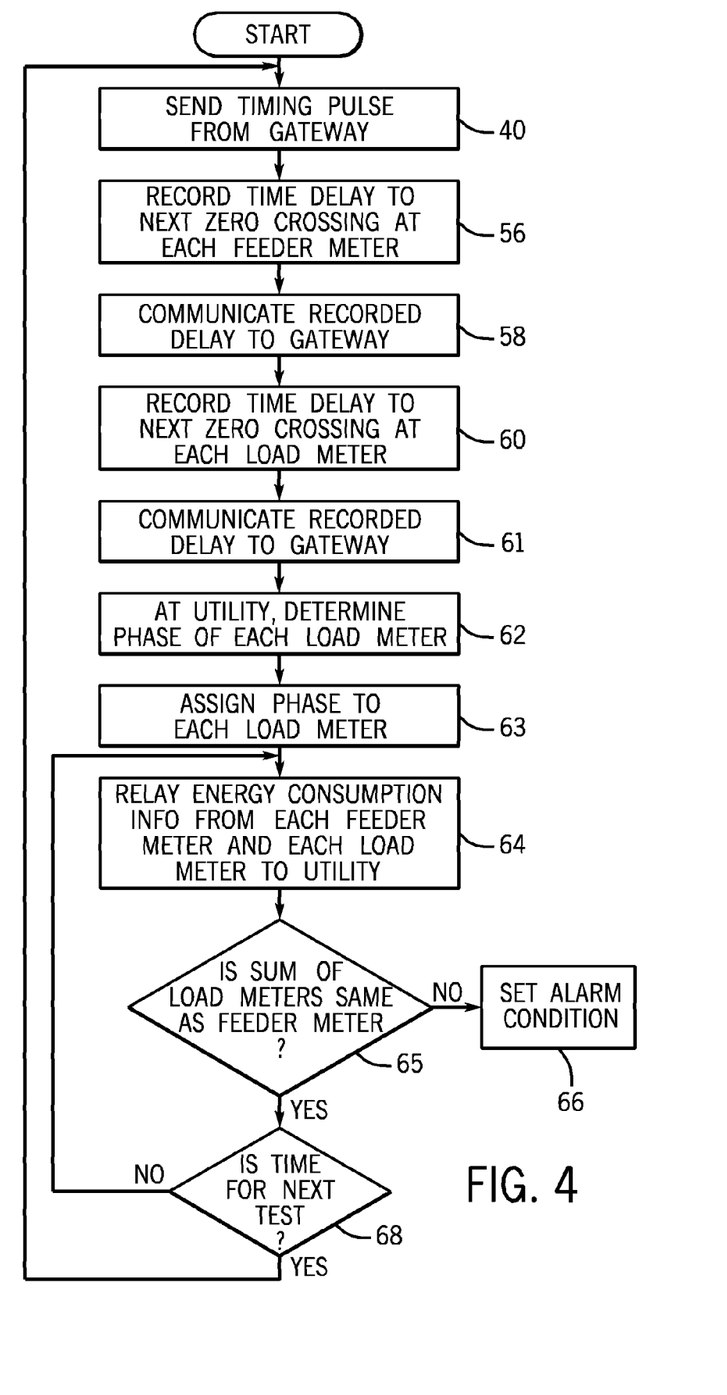
FIG. 4 is a flowchart illustrating one embodiment of the present disclosure.

Once each of the feeder meters 34, 36 and 38 has recorded the delay from the timing pulse signal to the zero crossing of the phase the feeder meter is serving, as shown in step 56 of FIG. 4, the individual feeder meters 34-38 can relay the recorded delay to the gateway 30, as shown in step 58. The gateway 30 can then relay this recorded delay information to the utility 12 such that the back end server at the utility 12 can compare the time delay from the timing pulse to the zero crossing for each load meter connected to each phase of the three-phase power supply based upon the previously determined reference time delays for each phase based on the time delay from each of the feeder meters 34-38.

Referring back to FIG. 2, in addition to each of the feeder meters 34-38 recording the delay from the receipt of the timing pulse to the next zero crossing, each of the load meters 26 records the same delay, as illustrated in step 60. Since each of the load meters 26 is connected to one of the three phases shown in FIG. 3, each of the load meters 26 will receive the timing pulse 42 and record the delay to one of the three zero crossings 46, 48 and 54. If the individual load meters 26 are located relatively close to the gateway 30, the timing pulse generated by the gateway 30 will not be delayed to any of the individual load meters 26. Thus, it can be assumed that each of the load meters 26 receives the timing pulse 42 at nearly the same time relative to the other load meters 26. Further, since each of the load meters 26 receives power from the same pole mounted transformer 16, the phase of the electricity received by each of the load meters 26 will not be delayed relative to its feeder meter 34-38.

In the same manner as described with respect to the feeder meters 34-38, each of the load meters 26 records one of the time delays $t_1$, $t_2$, or $t_3$, depending on the phase of power being supplied to the load meter. The time delay is recorded within the electricity meter and is relayed back to the gateway in step 61 of FIG. 4. Once the delay from each of the load meters 26 is received at the gateway, the gateway 30 in turn relays this information to a back end server 63 at the utility 12. Typically, the delay for each of the load meters 26 is relayed to the utility 12 including unique identification information that identifies the load meter 26.

Once the utility 12 has received the time delay information from each of the feeder meters 34-38 and the plurality of load meters 26, the software operating on the back end server 63 of the utility 12 can determine the phase of each load meter in step 62.

In one exemplary embodiment, the back end server at the utility 12 knows the phase of each of the feeder meters 34, 36 and 38 based upon the initial setup of the power distribution system. Since the phase of each of the feeder meters 34, 36 and 38 is known, the reference time delay recorded by the feeder meter 34 will be close to the time delay for all meters receiving power from phase 1. Likewise, the reference time delay from feeder meter 36 represents the time delay for all load meters receiving power from phase 2 and the reference time delay for feeder meter 38 represents the time delay for all of the load meters connected to phase 3. Based upon the known reference time delay for each of the three phases, the software on the back end server 63 on the utility 12 can then match the measured delay from each of the load meters 26 to the measured reference time delays from the feeder meters. In this manner, each of the load meters are grouped into one of three categories. Based on the categories, the software at the utility can classify each of the plurality of load meters 26 shown in FIG. 2 as being connected to one of the three phases, as shown in step 63.

Once the back end server 63 at the utility 12 has determined the phase for each of the plurality of load meters 26, the utility can aggregate the total consumption for the load meters 26 on each of the three phases. Once this information has been collected and combined in step 64, the utility 12 can then identify unbalanced conditions on any of the three phases 20, 22 or 24. If the utility identifies an unbalanced condition, the utility can either physically transfer loads from one phase to another or ensure that any additional loads connected to the electricity distribution system are added to the phase having the lowest consumption value.

In addition to allowing a utility to balance loads over each of the three phases, the system shown in FIG. 2 also allows the utility to determine the amount of line losses or theft that may be occurring. Specifically, as shown in step 65, once the utility determines the phase for each of the individual load meters 26, the utility can compare the sum of the energy consumption for each of the load meters connected to an individual phase to the meter reading from the feeder meter for the specific phase. As an example, the meter reading from feeder meter 34 should approximately equal the combined readings from each of the load meters 26 connected to supply line 20. If the sum of the metered electricity by each of the load meters 26 connected to phase 1 is significantly less than the value recorded by feeder meter 34, the utility can determine that significant losses are occurring along line 20. The utility can then investigate the reason behind the losses to determine if a theft is occurring. This same analysis can be carried out for line 22 and line 24. As can be understood above, once the utility 12 has determined which phase each of the load meters 26 is connected to, the system can combine the meter readings for each of the individual phases and compare the combined reading to the reading from the feeder meters 34-38.

Referring back to FIG. 4, if the system determines that the sum of the load meters for a specific phase is not the same as the reading from the feeder meter, the system can set an alarm condition in step 66. However, if the system determines that the sum of the load meter is approximately the same as the reading from the feeder meter for that phase, the system can then determine if it is time for the generation of the next timing pulse. Typically, the timing pulse could be generated once a day, once a week or at other time intervals depending upon the system requirement. Once the phase of each load meter is known, it is unlikely that the phase of the load meter will change without direct action by the utility. Thus, the time interval between the generation of the timing pulses could be on a daily or weekly basis depending upon the number of load meters being added to the system by the utility.

As described above in the first embodiment, the phase of each of the feeder meters 34-38 is known prior to the generation of the timing pulse from the gateway 30. The phase of the individual feeder meters 34-38 allows the system to compare the time delay from the feeder meters 34-38 to the time delay from each of the load meters 26. However, another embodiment is also contemplated which will be set forth below, in which the feeder meters 34-38 could be eliminated from the system.

In a second embodiment of the present disclosure, the gateway 30 is connected to one of the phases of the electricity supply. The gateway 30 will be configured to include a zero detector that allows the gateway 30 to determine a zero crossing of the phase to which the gateway is connected.

Figure 5:
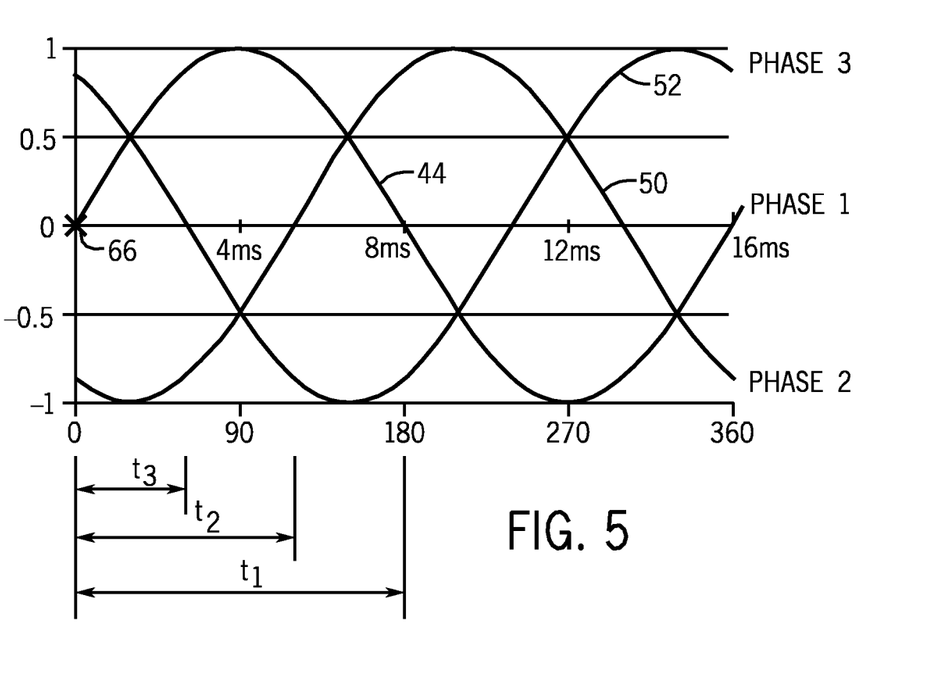
FIG. 5 is a graphical representation of the three phases of an electricity supply in accordance with a second embodiment of the present disclosure.

Referring now to FIG. 5, in the embodiment being described, the gateway 30 is connected to phase 1. In accordance with the second embodiment, the gateway 30 generates the timing pulse 66 at the zero crossing of phase 1. In addition to sending the timing pulse 66, the gateway also sends a message that indicates the number of milliseconds to the next zero crossing. In the embodiment shown in FIG. 5, the time delay from the timing pulse 66 to the next zero crossing is approximately eight milliseconds.

Once the timing pulse has been sent, each of the individual load meters 26 receives the timing pulse and determines the time delay for the next zero crossing for the individual load meter. In the embodiment shown in FIG. 5, if the load meter is connected to phase 3, the time delay is shown by reference $t_3$. Likewise, if the load meter is connected to phase 2, the time delay is shown by reference $t_2$.

Since the message from the gateway 30 includes information regarding the time delay $t_1$, which represents the next zero crossing for phase 1, the individual load meters can compare the time delay for their power supply to the time delay from the gateway. In this manner, each of the individual load meters can determine its own phase. Since each of the individual meters is able to determine its own phase based upon the timing pulse from the gateway, each of the individual meters can relay the phase information back to the utility 12. In this manner, the individual load meters, rather than the utility, determine the phase of the individual meter. Based upon this configuration, the system no longer needs the feeder meters shown in FIG. 2 to determine the phase for each of the individual meters.

Alternatively, each of the individual load meters could record the time delay from receipt of the timing pulse until the next zero crossing for the phase to which the load meter is connected. Instead of determining the phase based upon the time delay, the individual load meters could relay the time delay back to the utility 12 where the end server 63 can determine the phase for each of the meters. In such an embodiment, the individual load meters would not need to determine their own phase and such processing would be carried out at the end server 63.

As set forth in the two embodiments described above, the system and method of the present disclosure allows a gateway 30 to send a timing pulse that is received by each of the load meters. Based upon the delay from the timing pulse to the next zero crossing for the load meter 26, the system can determine the phase for each of the individual loads.

Once the phase for each of the individual load meters is known, the utility can then aggregate the meter information based upon the specific phase. This information can be utilized for a variety of purposes, as described above. It should be understood that various other methods and systems for receiving the test pulse and determining the phase of a meter can be carried out while operating within the scope of the present disclosure.

In the embodiment shown in FIG. 2, an assumption is made that little to no phase delay occurs in the voltage signal traveling from the utility 12 to each of the load meters 26. Under such assumption, the distance between the utility 12 and the load meters 26 is ignored and an assumption is made that each of the load meters 26 coupled to phase 1 will be 120° out of phase with the voltage signal supplied to the load meter 26 connected to phase 2. However, it is contemplated that a phase delay may occur due to the length of the transmission line. Such a phase delay would cause difficulty in determining whether the phase delay was induced by the length of the transmission line or whether two load meters were on different distribution phases. Thus, it is contemplated that the system of the present disclosure could include a method for estimating a meter transmission line induced phase delay.

In accordance with such method, each of the load meters is programmed with information regarding their latitude and longitude during installation. Thus, the system would know the physical location of each of the load meters on the electric grid. Based upon this physical location, the system could calculate the distance between the utility substation and the individual meter. Based upon this distance, the system could then determine a phase delay due to the length of the transmission line. Based upon this phase delay information, the system could then calculate the transmission line induced delay when determining the phase for each of the individual meters.

In addition to the transmission line delay that may create phase delay, it is also contemplated that propagation delay between the RF signal from the gateway 30 to each of the load meters 26 could also occur. Although this propagation delay may not cause a significant error (0.1 ms for about 18 miles of propagation), the system will know the distance of the load meter 26 from the gateway 30, which would allow the system to estimate delay caused by the RF propagation. Once this delay due to RF propagation is known, the delay can be compensated in the system.

We claim:

1. A method of monitoring a load on a three-phase power supply that provides power to a plurality of load meters each connected to one of three supply lines of the power distribution system, wherein each of the supply lines carries a different one of the three voltage phases, the method comprising the steps of:
   connecting a feeder meter to each of the three supply lines, wherein each of the feeder meters is positioned between the power supply and the load meters and wherein the phase of the supply line to which each of the three feeder meters is connected is known;
   transmitting a timing pulse;
   receiving the timing pulse at each of the three feeder meters;
   determining a feeder time delay at each of the feeder meters, the feeder time delay being the delay from the receipt of the timing pulse until a landmark value of the single phase voltage received by the feeder meter;
   designating each of the feeder time delays as one of three reference time delays based upon the known phase of the feeder meter
   receiving the timing pulse at each of the plurality of load meters;
   determining a time delay at each of the load meters, the time delay being a measured time from the receipt of the timing pulse until a landmark value of the single phase voltage received by the load meter;
   comparing the determined time delay from each of the plurality of load meters to the three reference time delays, each of the three reference time delays being associated with one of the three phases; and
   assigning one of the three phases to each load meter based upon the closest reference time delay to the determined time delay for the load meter.

2. The method of claim 1 wherein the landmark value of the single phase voltage is a zero crossing.

3. The method of claim 1 further comprising the steps of:
   transmitting energy consumption data from each of the load meters to an end server; and
   aggregating the energy consumption data for the plurality of load meters for each of the three phases based upon the designated phase for the load meter.

4. The method of claim 3 further comprising the step of generating an alarm condition when the aggregated energy consumption on each of the three phases is unbalanced.

5. The method of claim 3 further comprising the steps of:
   comparing the aggregated energy consumption for each of the three phases to energy consumption information from each of the three feeder meters; and
   generating an alarm when the aggregated energy consumption on any of the three phases is below the energy consumption information from the feeder meter for that phase by more than a threshold value.

6. The method of claim 1 wherein the timing pulse is a wireless signal received by each of the plurality of load meters.

7. A system for determining the load on each phase of a three-phase power supply, comprising:
   a plurality of load meters each connected to one phase of the three-phase power supply;
   at least three feeder meters each positioned to receive one phase of the three-phase power supply
   a wireless transmission device positioned to generate a wireless timing pulse received by each of the plurality of load meters and each of the feeder meters, wherein each of the plurality of load meters is operable to determine a time delay from receipt of the timing pulse until a first zero crossing of the single phase voltage, wherein each of the feeder meters determines a reference time delay from the receipt of the timing pulse at the feeder meter until a zero crossing of the single phase received by the feeder meter, the load meter further including a transmission device to wirelessly transmit the determined time delay; and
   an end server operable to receive the determined time delay from each of the load meters and group each of the load meters into one of the three phases based upon a comparison between the determined time delay from each meter and the reference time delays from the feeder meters.

8. A method of monitoring a load on a three-phase power supply that provides power to a plurality of load meter each connected to one of three supply lines of a power distribution system, wherein each of the supply lines carries a different one of three voltage phases, the method comprising the steps of:
   connecting a feeder meter to each of the three supply lines, wherein each of the feeder meters is positioned between the power supply and one or more of the load meters, wherein the phase of the supply line to which each of the three meters is connected is known;
   transmitting a wireless timing pulse that is received by each of the plurality of load meters and each of the feeder meters;
   determining a reference time delay at each of the feeder meters, the referenced time delay being the delay from the receipt of the timing pulse at the feeder meter until a zero crossing of the single phase voltage received by the feeder meter;
   determining a time delay at each of the load meters, the time delay being a measured time from the receipt of the timing pulse until a landmark value of the single phase voltage received by the load meter;
   comparing the time delay from each of the plurality of load meters to the three reference time delays from the feeder meters;
   assigning each of the plurality of load meters to one of the three feeder meters based upon the similarity between the reference time delay from the feeder meters and the determined time delay at each of the load meters;
   transmitting energy consumption data from each of the load meters and each of the feeder meters to an end server;

aggregating the energy consumption data for the plurality of load meters for each of the three phases based upon the designated phase for the load meter;

comparing the aggregated energy consumption for each of the three phases to energy consumption information from each of the three feeder meters; and generating an alarm when the aggregated energy consumption on any of the three phases is below the energy consumption information from the feeder meter for that phase by more than a threshold value.

9. The method of claim 8 wherein the reference time delays are determined prior to determination of the time delay from each of the load meters.

\* \* \* \* \*